United States Patent

Zortea et al.

[11] Patent Number: 5,809,072
[45] Date of Patent: Sep. 15, 1998

[54] MIXED SIGNAL ADAPTIVE EQUALIZER

[75] Inventors: Anthony E. Zortea, Pipersville; James McGough, Chalfont; Kenneth Paist, Spring City, all of Pa.

[73] Assignee: Integrated Circuit Systems, Valley Forge, Pa.

[21] Appl. No.: 616,750

[22] Filed: Mar. 15, 1996

[51] Int. Cl.⁶ .................................................. H03H 7/30
[52] U.S. Cl. ...................... 375/232; 364/724.2; 333/18
[58] Field of Search .................................. 375/229, 232, 375/230; 333/18, 28 R; 364/724.19, 724.2

[56] References Cited

U.S. PATENT DOCUMENTS

| | | | |
|---|---|---|---|
| 5,157,691 | 10/1992 | Ohkubo et al. | 375/232 |
| 5,323,423 | 6/1994 | Townsend et al. | 375/232 |
| 5,455,843 | 10/1995 | Cherubini et al. | 375/230 |
| 5,481,564 | 1/1996 | Kakuishi et al. | 375/230 |
| 5,586,144 | 12/1996 | Kahlman et al. | 375/229 |

*Primary Examiner*—Temesghen Ghebretinsae
*Attorney, Agent, or Firm*—Townsend and Townsend and Crew LLP

[57] ABSTRACT

An equalizer receives an analog input signal and filters the signal to undistort the input signal. A converter stage converts the analog input signal into a digital output signal for use in a digital system. A bit sequence indicator analyzes the structure of the digital output signal to determine whether any errors have occurred in transmission and conversion. An adaptor state machine causes the modification of the analog signal based on a feedback loop including information on the errors detected in the packets of digital signals, rather than the analog data itself.

9 Claims, 5 Drawing Sheets

MIXED SIGNAL ADAPTIVE EQUALIZER

BACKGROUND OF THE INVENTION

The present invention relates to equalizer circuits. More particularly, the invention relates to the accurate recovery and equalization of the high frequency components of an analog input signal to produce a digital output signal by an equalizer circuit on a single integrated circuit chip.

In networking applications, a critical challenge that must always be overcome is guaranteeing the integrity of a signal being transmitted across the network. One signal integrity problem often encountered is the attenuation of the signal over cabling in the network as the signal is transmitted between nodes. Therefore, a receiving node on the network will typically include circuitry to recover and equalize the incoming signal so that is easily processed for further applications. For example, in an Ethernet network, a computer system coupled to the network uses a physical layer transceiver to equalize an analog input signal and produce a converted digital output signal that is suitable for processing elsewhere within the computer system. Equalization in a physical layer transceiver is typically achieved by filtering the analog input signal. Since the high frequency components of the analog input signal generally exhibit more attenuation, a high-pass filter is typically implemented in the equalizer circuit to recover and boost the high frequency components of the analog input signal.

The length of the cabling connecting different nodes in a network will of course vary as a function of the network application. A particular problem encountered as the length of the cabling varies is that the electronic signal transmitted across the network cabling will degrade differently depending upon the cable length. Therefore, the equalization circuit in the physical layer transceiver in an Ethernet network, for example, must be adapted or adjusted for varying cable lengths in order to obtain the highest quality digital output signal possible. The analog input signal could be a two-level or a three-level signal (such as MLT-3). For a square wave, the high frequency components have a different group delay and gain from the low frequency components, which yields a distorted signal after it travels for a given distance on a network cable. Thus, for example, the cutoff frequency of the high-pass filter could be adjusted according to the level of attenuation of the input signal. Otherwise, the equalizer will tend to underboost or overboost the analog input signal, resulting in errors in the converted digital output signal. For example, the converted digital output signal of the equalizer may incorrectly include a high ("1") voltage value at a point where there should be a low ("0") voltage value that would properly reflect the analog input signal, or vice versa.

Prior equalizer circuits address this problem by minimizing the error of some feature of the analog signal, such as the peak-to-peak voltage, which is an indirect indicator of the cable length. Thus, based upon the variation of the peak-to-peak voltage of the analog input signal, for example, the cutoff frequency of the high-pass filter used in equalization is adjusted to compensate for different cable lengths. This solution is not particularly desirable, however, since the key criterion is not used to adjust the input filter, namely the quality of the equalizer's digital output signal. Thus, a filter adjusted according to the variations in peak-to-peak voltage of the analog input signal does not necessarily produce an error-free digital output signal. The equalizer circuit may still underboost or overboost the analog signal, resulting in errors in the digital signal, as described above. These errors in the equalizer's digital output signal would then ripple throughout the entire system, which could lead to system failure.

Therefore, an improved equalizer circuit is desired that provides error-free data recovery of an analog input signal for differing cable lengths in a network application.

SUMMARY OF THE INVENTION

The present invention provides an improved method and apparatus for achieving error-free data recovery of an analog input signal to produce a clean digital output signal across varying cable lengths in a network. An adaptive equalizer is implemented in a fully integrated mixed-signal transceiver for use in a network. The equalizer receives an analog input signal from a cable in the network and filters the signal to undistort the input signal. A converter stage converts the analog input signal into a digital output signal for use in the digital system coupled to the network. A bit sequence indicator analyzes the structure of the digital output signal to determine whether any errors have occurred in transmission and conversion. An adaptor state machine triggered by the output of the bit sequence indicator provides a control signal to the filter to control filter operation, improving the quality and accuracy of the equalized analog signal and minimizing the number of errors in data recovery. Preferably, then, the correction to the filter that processes the analog data is based on a feedback loop including information on the errors detected in the packets of digital signals, rather than the analog data itself.

A further understanding of the nature and advantages of the inventions herein may be realized by reference to the remaining portions of the specification and the attached drawings.

DESCRIPTION OF THE PREFERRED EMBODIMENT

Figure 1A:
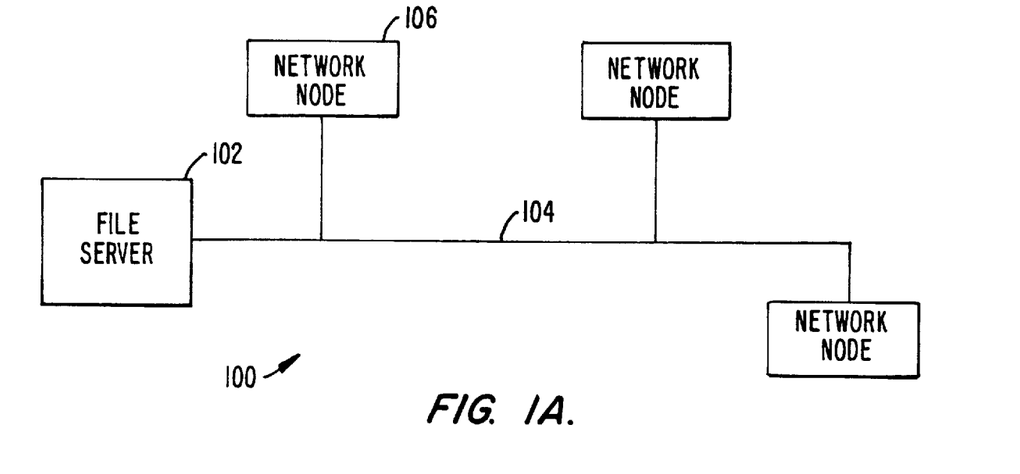
FIG. 1A shows a simplified block diagram of a network in which the present invention may be implemented.

FIG. 1A shows a simplified block diagram of a sample network 100 in which the present invention may be implemented. A file server 102 is coupled via cable 104 to network nodes 106. In an alternate embodiment, a hub or concentrator may couple file server 102 to network nodes 106. Typically, network nodes 106 transmit data to each other as well as file server 102. In one example, network 100 may be an Ethernet network, such as a 10Base-T or a 100Base-Tx network, described by well-known standards and specifications.

Figure 1B:
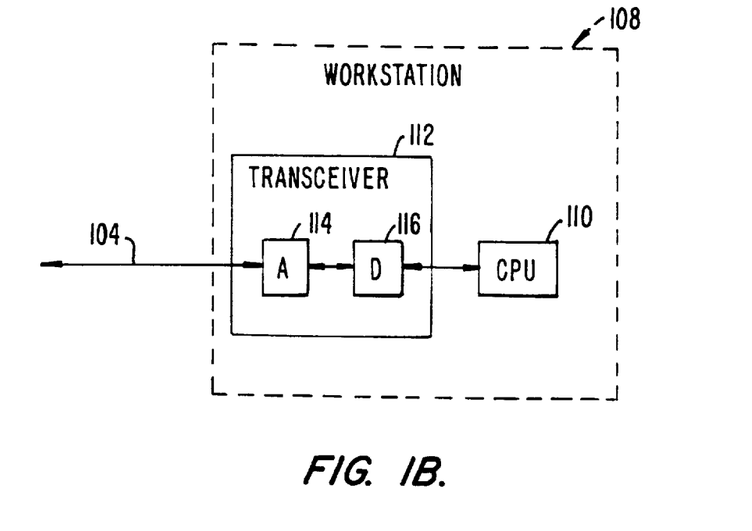
FIG. 1B shows a block diagram of a workstation including the present invention that is coupled to a network.

FIG. 1B shows additional detail of a particular type of network node 106, specifically a workstation 108. Workstation 108 includes a CPU 110 and a transceiver chip 112 coupled to network cable 104. It should be understood that in an alternate embodiment, transceiver chip 112 may be located external to workstation 108. According to one embodiment of the present invention, transceiver chip 112 is a fully integrated mixed-signal physical layer transceiver for use in an Ethernet network that includes both analog and digital processing circuitry in a single integrated circuit chip package. Transceiver 112 receives and processes analog input signals from cable 104 in analog section 114 and converts the processed analog signals into digital signals in digital section 116. The converted digital signals are processed further by transceiver 112 before being transmitted to CPU 110 for use in workstation 108. In the reverse direction, CPU 110 issues digital signals that are received and processed by digital section 116. The processed digital signals are converted into analog signals in analog section 114. The converted analog signals are then processed until they are suitable for transmission over cable 104 to other nodes on network 100.

Figure 2:
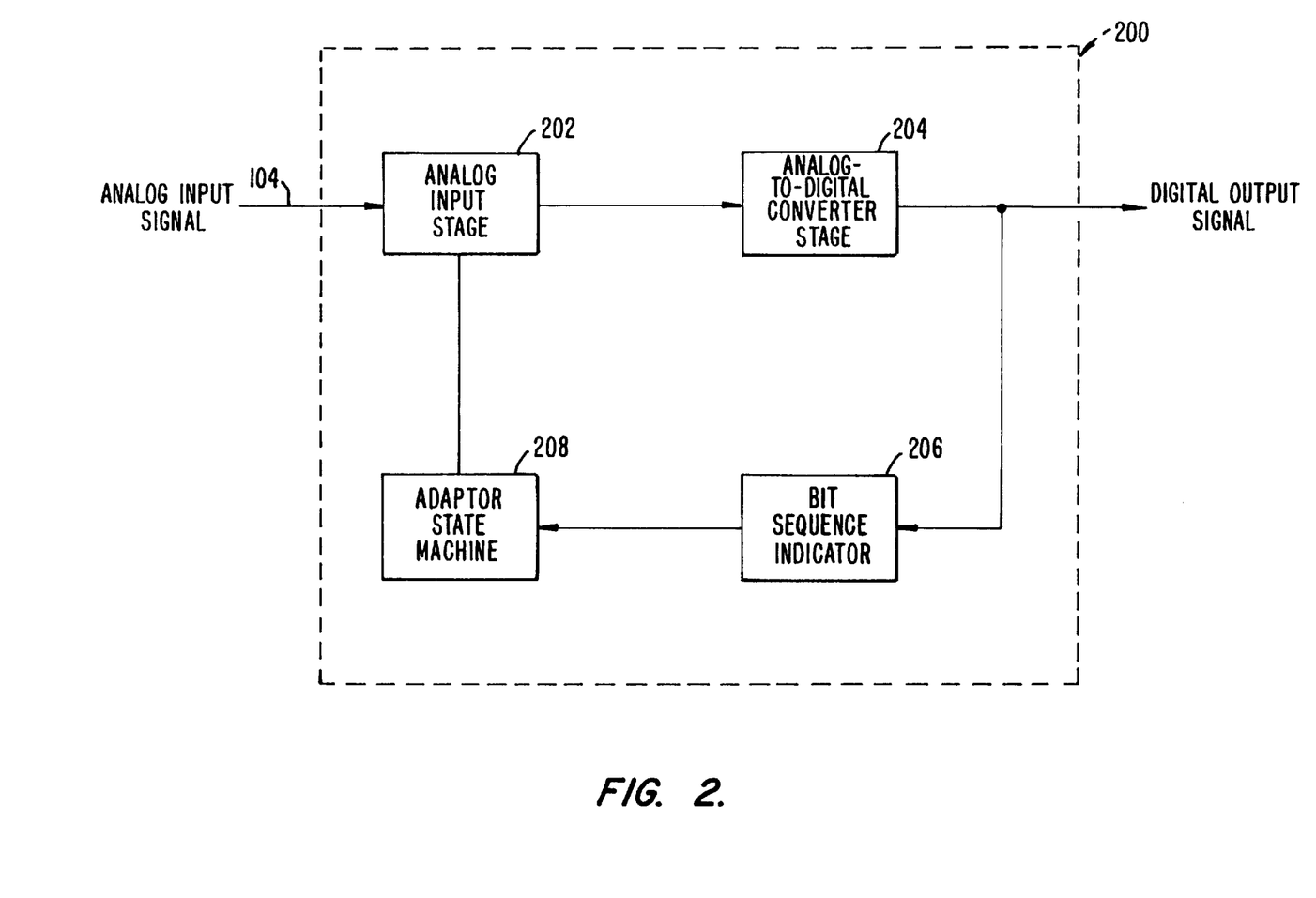
FIG. 2 shows a simplified block diagram of an adaptive equalizer according to the present invention.

Because both analog and digital functions are packaged into one integrated circuit chip, the equalizer of the present invention can, in a preferred embodiment, conveniently be implemented within a single chip, such as transceiver 112. FIG. 2 shows a simplified block diagram of an adaptive equalizer 200 according to the present invention. Network cable 104 is coupled to an analog input stage 202, which receives and filters an analog input signal on cable 104. As described above, cable 104 connects different nodes of a network together, so the input signal may be a transmission from one workstation on the network to another. Analog input stage 202 includes circuitry to equalize selected portions of the input signal. Since the high-frequency components of an analog signal degrade significantly during transmission over network cabling, a high-pass filter is typically implemented to equalize the high-frequency components of the analog input signal. In a preferred embodiment, explained in further detail below, the high-pass filter in analog input stage 202 is a variable filter where one of a plurality of cutoff frequencies is selected by a control signal. Analog-to-digital converter stage 204 is coupled to analog input stage 202 and converts the filtered analog input signal into a digital output signal suitable for processing elsewhere in the workstation, for example.

A bit sequence indicator 206 is coupled to the output of converter stage 204 to receive and analyze the structure of the digital output signal. In a preferred embodiment, explained in further detail below, bit sequence indicator 206 monitors the digital bit stream for a proper sequence of signals and identifiers to determine whether any errors exist in the converted digital output signal. Adaptor state machine 208 receives signals representing the identifiers in the digital bit stream from bit sequence indicator 206 which trigger the state machine. The output of adaptor state machine 208 is a control signal to analog input stage 202 that, based upon errors in the digital output signal, adjusts the equalizer to eliminate any potential underequalization or overequalization, minimizing the errors incurred in data recovery from the network by the associated network node. Thus, a feedback loop is established wherein a filtered analog signal is converted into a digital signal, and the structure of the digital signal is used to control the operation of the equalizer that receives the analog signal.

Figure 3:
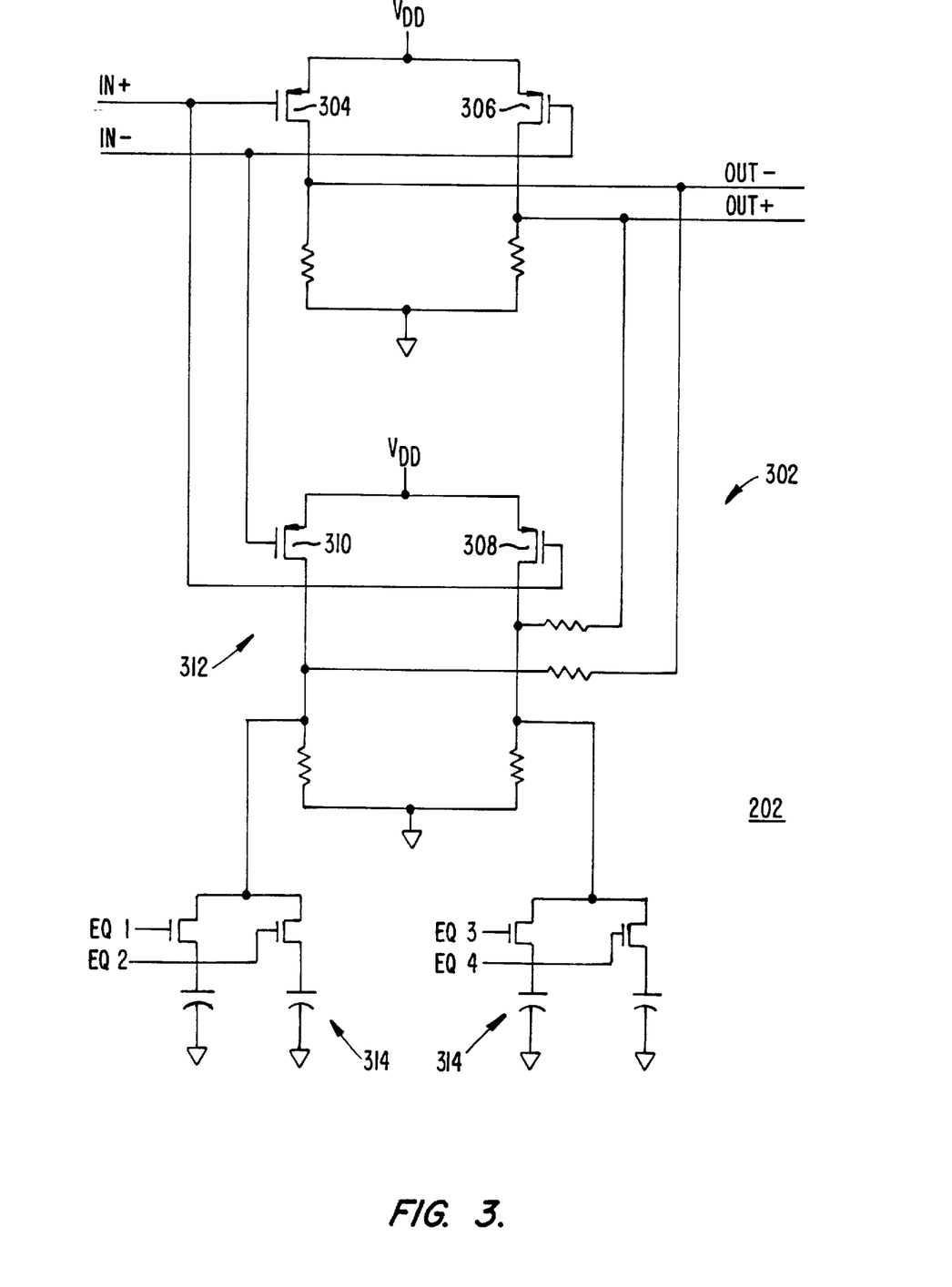
FIG. 3 shows a simplified block diagram of an analog input stage of the present invention.

FIG. 3 shows a simplified block diagram of analog input stage 202. The analog input stage includes a variable differential equalizer 302 that implements a plurality of capacitors which permit the cutoff frequency of the equalizer to be adjusted to a desired setting. A preferred embodiment of equalizer 302 is described in application Ser. No. 08/563,032, filed Nov. 27, 1995, assigned to the assignee of the present application, and hereby incorporated by reference, where a high-pass transfer function is obtained by amplifying the flat response of an input signal and subtracting from it the low-pass response of the input signal. Again, a high-pass function is desired since the high-frequency components of analog input signal suffer from significant attenuation after transmission over network cabling.

In operation, a differential analog input signal with inputs In+ and In− are input to signal amplification transistors 304 and 306, respectively, of equalizer 302, which produce a flat response of the input signal. The true output signal Out+ is taken from the output of signal amplification transistor 306, while the complement output signal Out− is taken from the output of signal amplification transistor 304. At the same time, inputs In+ and In− are also input to signal amplification transistors 308 and 310, respectively, of low pass filter 312. A plurality of capacitors 314 are coupled in parallel to achieve the low-pass transfer function. One of the control signals Eq1-Eq4 selects the particular capacitor to be coupled to the filter, thereby permitting a selected cutoff frequency to be set for the high-pass transfer function of equalizer 302. The control signals are provided by adaptor state machine 208, as described further. It should be understood that four capacitors are shown in the figure merely as an example, and that any number of capacitors may be coupled to the equalizer.

The true output signal Out+ is taken from the output of signal amplification transistor 234 and added to the true output signal from amplifier 202, while the complement output signal Out− is taken from the output of signal amplification transistor 232 and added to the complement output signal from amplifier 202 to obtain the high-pass function. The output of equalizer 302 is therefore a filtered version of the analog input signal that may be converted into a digital signal for use within a digital network node, such as a workstation.

Figure 4:
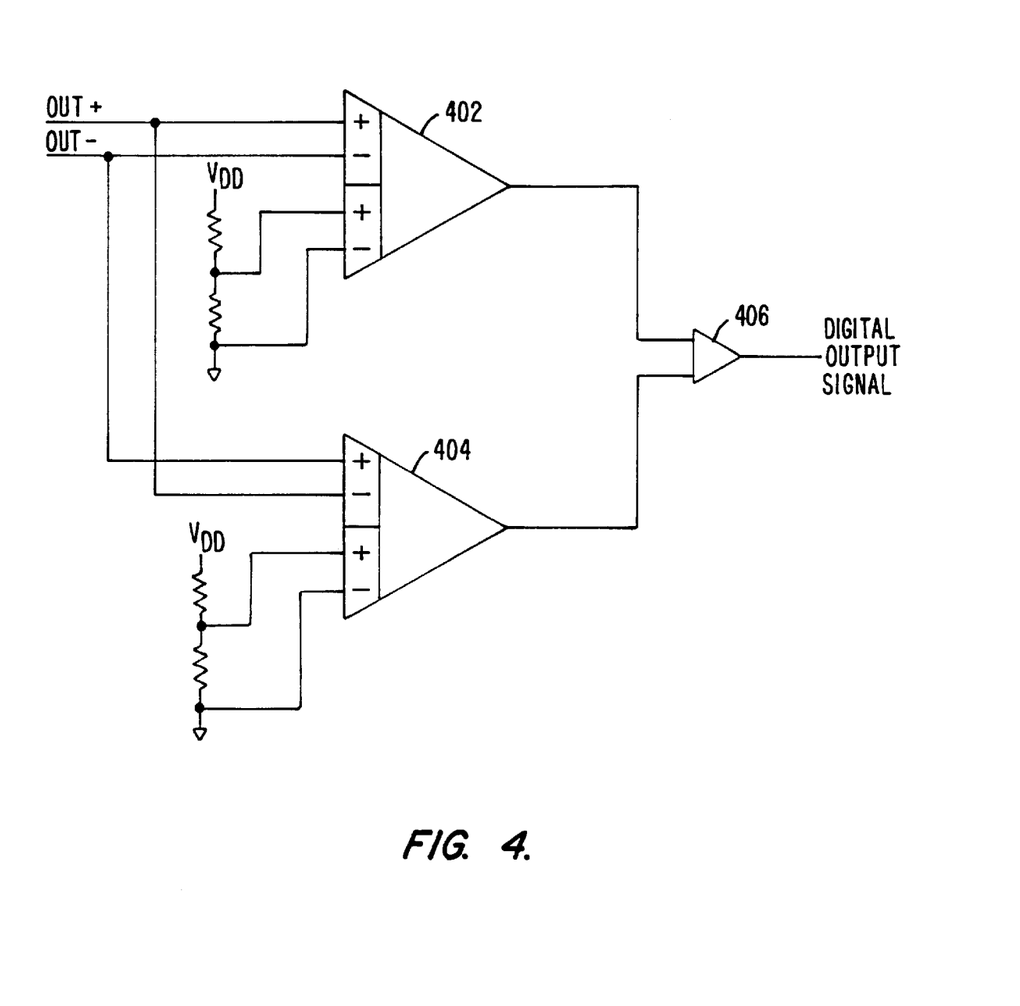
FIG. 4 shows a simplified block diagram of an analog-to-digital converter stage according to the present invention.

FIG. 4 shows a simplified block diagram of analog-to-digital converter stage 204. In a preferred embodiment, converter stage includes differential comparators 402 and 404 coupled to the differential filtered analog signal (Out+ and Out−) that is output from input stage 202 (FIG. 3). In operation, differential comparator 402 receives the filtered signal and compares it to a reference voltage level to determine whether the true signal is to be converted to a HIGH or a LOW digital signal. Likewise, differential comparator 404 receives the filtered signal and compares it to a reference voltage level to determine whether the complement signal is to be converted into a HIGH or a LOW digital signal. The outputs of comparators 402 and 404 are input to OR gate 406, whose output is the converted digital output signal that may be processed further in the network node.

Once the analog input signal has been converted into a digital output signal, the present invention makes a determination as to whether any errors exist in the converted digital output signal. For if there are errors resulting from underboosting or overboosting in the input stage 202, the cutoff frequency of equalizer 302 needs to be adjusted. For example, in a 100Base-T Ethernet network, a transmission of data will involve a number of signals or identifiers encoded in the data itself to signify the complete transmission of one packet. A data transmission in a 100Base-T network has the following structure:

<Idle><Start Packet><Data><Stop Packet><Idle> Thus, an Idle identifier precedes and follows the entire data packet and is a single symbol in length. At the physical layer, symbols are made up of a sequence of five bits. Following the initial Idle identifier is a Start Packet identifier made up of three symbols, labeled as I, J and K, where each of the three has a distinct bit sequence. The Data naturally follows the Start Packet identifier, can include any one of sixteen symbols and is variable in length. Following the Data is a Stop Packet identifier made up of two symbols, T and R, again each having a distinct pattern. Bit sequence indicator 206 monitors the bit stream of the converted digital output signal and provides the following signals for each element of the above data structure:

<Idle>—Idle Detect
<Start Packet>—IJK Detect
<Data>—Invalid Symbol
<Stop Packet>—TR Detect Each of these signals is provided to adaptor state machine 208, which counts errors by checking the bit stream of the digital output signal for the precise structure shown above. Any deviation from the prescribed structure constitutes an error.

Figure 5:
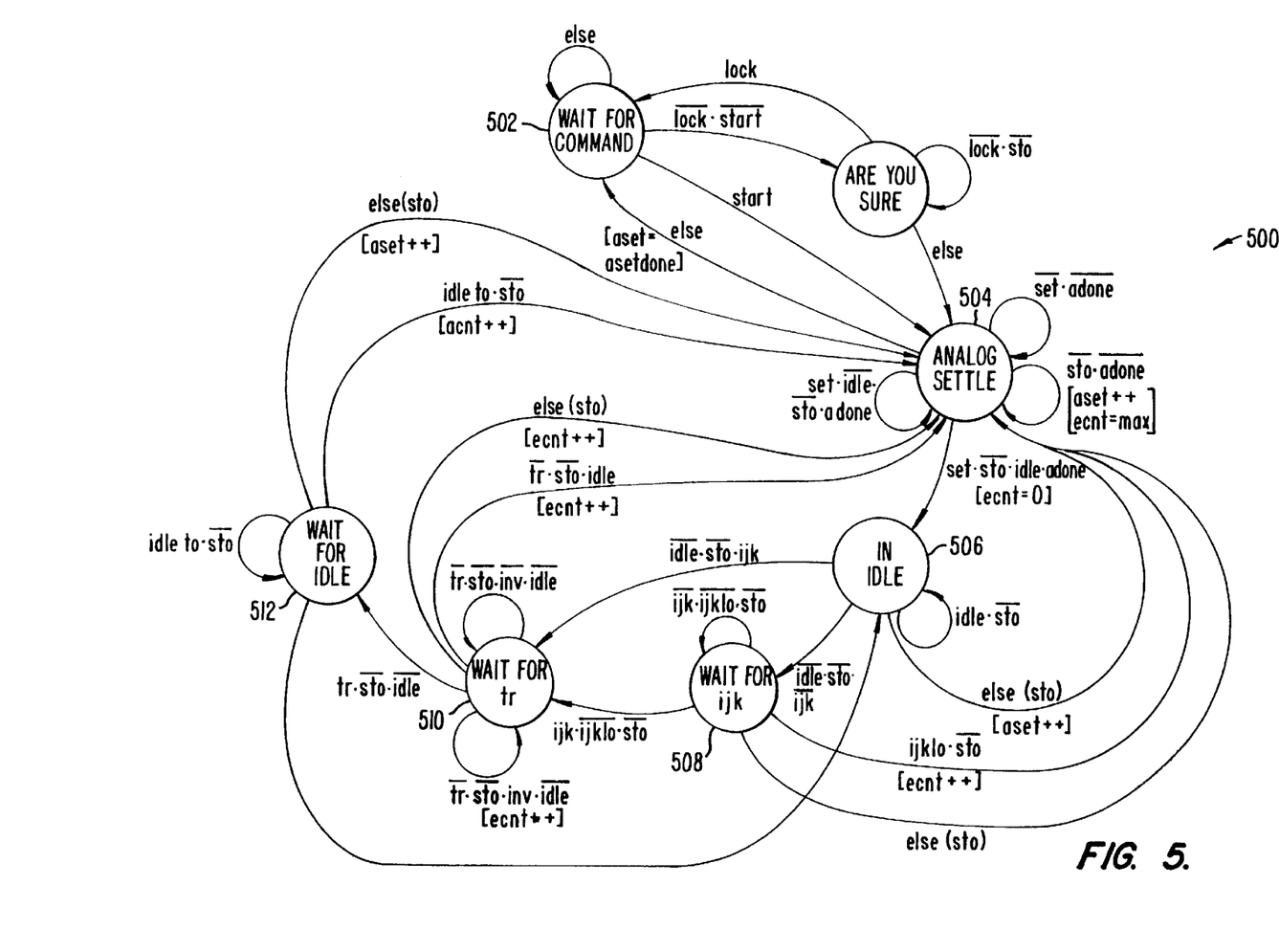
FIG. 5 shows a flow diagram depicting the decision-making process of an adaptor state machine of the present invention.

Adaptor state machine 208 is triggered by the above signals from bit sequence indicator 206. FIG. 5 shows a flow diagram 500 depicting the decision-making process of adaptor state machine 208. The state machine sits in Wait for Command state 502 until initially triggered by the loss of a lock signal to the equalizer, signifying that a relatively large number of errors (beyond a predetermined threshold) have been found in the signal transmission. This condition occurs, for example, at system powerup, system reset, or at other times when the system is experiencing a significant number of errors in data transmission. The state machine then proceeds to Analog Settle state 504, where the state machine waits for the system, including phase-locked loops, for example, to settle. In a preferred embodiment, analog input stage 202 has a plurality of settings that are exercised by adaptor state machine 208. For example, in the case where a high-pass filter is the input circuitry for receiving a signal from the network, the cutoff frequency of the filter is adjusted by state machine 208 to find the optimal frequency. In one example, a register Aset, as shown in FIG. 5, stores the current equalizer setting. Then, the state machine processes the converted digital signal and keeps track of the errors in a register Ecnt, again as shown in the example of FIG. 5. State machine 208 will eventually identify the setting for the analog input stage that ensures the fewest errors in the converted digital output signal through a feedback loop.

Thus, state machine 208 next proceeds to In Idle state 506 upon receiving an Idle Detect indicator from bit sequence indicator 206, signifying that a first idle signal preceding a data transmission has been detected. If any error is detected at this point, however, the error counter Ecnt is incremented and the state machine returns to the same state and waits for the next signal from bit sequence indicator 206. The equalizer setting is unchanged; however, if a scan timeout occurs, indicating that the no signals have been received for a large number of clock cycles (e.g. 1 ms), adaptor state machine 208 proceeds to the next equalizer setting by incrementing register Aset and restarts the state machine.

Returning to the state machine flow diagram, after losing the Idle Detect signal, state machine 208 proceeds to Wait for IJK state 508, where it waits for an IJK Detect signal from bit sequence indicator 206 signifying the receipt of a Start Packet identifier. After receiving an IJK Detect, the state machine advances to Wait for TR state 510, where it waits for a TR Detect signal from bit sequence indicator 206. During this time, adaptive equalizer 200 receives and processes data from the network. When a TR Detect signal is received, signifying the receipt of a Stop Packet identifier, and the end of the data, the state machine advances to Wait for Idle state 512, where it waits for the second idle signal at the end of a data transmission. Upon receiving another Idle Detect signal from bit sequence indicator 206, the state machine proceeds again to In Idle state 506.

At each of these states, state machine 208 keeps track of errors found in the converted digital output signal and increments error register Ecnt each time an error is encountered. Possible errors could include, for example, a local IJK timeout, where no IJK Detect signal is received in a specified amount of time from bit sequence indicator 206, or the failure to receive a TR Detect signal from bit sequence indicator 206. At the completion of an entire data transmission, state machine 208 advances the equalizer setting by incrementing register Aset. State machine 208 is therefore able to keep track of the number of errors found in the converted digital signal for each equalizer setting. After testing each possible equalizer setting, the state machine can determine the optimal equalizer setting for minimizing errors in the digital signal for the particular cable length.

Thus, state machine 208 outputs control signals, such as Eq1-Eq4 described above, for example, to analog input stage 202 to test each of the possible filter settings to determine the one (or more) settings that will minimize the error in the digital bit stream. Then, based upon that determination, the appropriate capacitor 314 (FIG. 3) in equalizer 302 can be switched into the circuit, yielding the best equalizer setting for a given cable length to minimize errors in the converted digital output signal. This optimal equalizer setting is then fixed for further equalizer operations. Attached in Appendix A is the Verilog code used to create a circuit for implementing the state diagram shown in FIG. 5.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

*ZORTEA et al.*
*3-15-96*

APPENDIX A

```
/************************************************************************
Filename: adapt2.v
Description: Second Adaptor. Finds the best equalizer setting.

Author: Anthony E. Zortea/ Ken Paist
Date:   2/14/96

Revivision History:

Rev     Date      Author          Comment
0.1     2.20.96   AEZ             For tapeout

*************************************************************************/
`timescale 100ps / 100ps
module adapt2(EQC2,ATC2,STATE, SCANTIMEOUT,LATENCYTIMEOUT,NEWBEST,ERROR,
   IDLE_DET,IJK_DETn,TR_DET,INV_CODE,LOCK,PDATA,TXER,RXCLK,CLK25,TEST,ADAPTST, output  [3:0] EQC2;                     // Equalizer setting
output  [2:0] ATC2;                     // Attenuator setting
output  [2:0] STATE;                    // Adaptor state machine state
output  SCANTIMEOUT;                    // Scan Timeout, combinational
output  LATENCYTIMEOUT;                 // Latency Timeout, combinational
output  NEWBEST;                        // A new best setting has been found, comb.
output  ERROR;                          // Error indication, comb.

input   [3:0] PDATA;                    // test inputs
input   TXER;                           // test input input   IDLE_DET,IJK_DETn,
        TR_DET,INV_CODE,LOCK,
        RXCLK,CLK25,TEST,
        ADAPTST,RESETn;                 // Various inputs as their names imply reg     [2:0] adapt_machine;            // Adaptor 2 state machine vector
reg     [2:0] ltmr;                     // Latency timer
reg     [14:0] stmr;                    // Scan timer
reg     [7:0] ecnt;                     // Error count
reg     [7:0] least_err;                // Best error registor
reg     [5:0] aset;                     // Adapter setting
reg     [4:0] best_set;                 // Best adapter setting
reg     [2:0] TSTSR;                    // Manual start edge detector
reg     ltmr_clr;                       // Sync. clear for latency timer
reg     stmr_clr;                       // Sync. clear for scan timer
reg     lock,idle,ijk,tr,inv;           // Mux'd and registered versions of inputs
reg     had_idle;                       // Had at least one idle wire    [3:0] EQC2;
wire    [2:0] ATC2;
wire    start;                          // Command to start adaptor #2
wire    analog_settled,ijkto,idleto,aset_done,sto,ecnt_maxed,newbest;
// ------------------------------------------------------------------------

// --- Test Outputs ------------------------------------------------------
wire    [2:0] STATE;
wire    SCANTIMEOUT;
wire    LATENCYTIMEOUT;
wire    NEWBEST;
wire    ERROR;
// ------------------------------------------------------------------------
```

```
`define err_max 8'hff
`define ecnt_max 8'hfe parameter
        fdly = 20;

// State machine states
parameter [2:0]
        wait_for_command = 3'b000,
        are_you_sure = 3'b001,
        analog_settle = 3'b010,
        in_idle = 3'b011,
        wait_for_ijk = 3'b100,
        wait_for_tr = 3'b101,
        wait_for_idle = 3'b110,
        unused = 3'b111;

//synopsys dc_script_begin
//set_dont_touch clk*
//synopsys dc_script_end

// Clock Buffering
mux21f  clk1(CLKt,RXCLK,CLK25,TEST);
buf3    clk2(CLK,CLKt);

// Mux and register inputs
always @(posedge CLK) lock = #fdly TEST ? TXER : LOCK;
always @(posedge CLK) idle = #fdly TEST ? PDATA[3] : IDLE_DET;
always @(posedge CLK) ijk  = #fdly TEST ? PDATA[2] : !IJK_DETn;
always @(posedge CLK) tr   = #fdly TEST ? PDATA[1] : TR_DET;
always @(posedge CLK) inv  = #fdly TEST ? PDATA[0] : INV_CODE;

/* ------------------ Adaptor #2 State Machine ---------------------*/
always @(posedge CLK or negedge RESETn) begin // Reset conditions
  if (!RESETn) begin
    adapt_machine = #fdly wait_for_command;
    ecnt = #fdly `err_max;
    aset = #fdly 5'h0;
    stmr_clr = #fdly 1'b1;
    ltmr_clr = #fdly 1'b1;
    had_idle = #fdly 1'b0;
    end
  else case (adapt_machine)

// ---------------------------------------------------------------
    wait_for_command: begin // We've lost lock
      if (!lock && !start) begin
        adapt_machine = #fdly are_you_sure;
        stmr_clr = #fdly 1'b1;
      end
```

```
  // Jump right to analog_settle on the start command
  else if (start) begin
    adapt_machine = #fdly analog_settle;
    stmr_clr = #fdly 1'b1;
    aset = #fdly 5'h0;
    ecnt = #fdly `err_max;
    had_idle = #fdly 1'b0;
  end else adapt_machine = #fdly wait_for_command;
end
// -------------------------------------------------------------

// -------------------------------------------------------------
are_you_sure: begin // Go back if lock is OK
  if (lock) adapt_machine = #fdly wait_for_command;

// Wait here until lock is lost for a whole sto
  else if (!lock && !sto) begin
    adapt_machine = #fdly are_you_sure;
    stmr_clr = #fdly 1'b0;
  end // Now we're sure
  else begin
    adapt_machine = #fdly analog_settle;
    stmr_clr = #fdly 1'b1;
    aset = #fdly 5'h0;
    ecnt = #fdly `err_max;
    had_idle = #fdly 1'b0;
  end
end
// -------------------------------------------------------------

// -------------------------------------------------------------
analog_settle: begin // Hasn't settled yet
  if (!analog_settled && !aset_done) begin
    adapt_machine = #fdly analog_settle;
    stmr_clr = #fdly 1'b0;
    had_idle = #fdly had_idle;
  end // Didn't even get idles, so set error to max
  else if (sto && !aset_done) begin
    adapt_machine = #fdly analog_settle;
    aset = #fdly aset + 1;
    ecnt = #fdly had_idle ? ecnt : `ecnt_max;
    stmr_clr = #fdly 1'b1;
    had_idle = #fdly 1'b0;
  end
```

```
      // Settled and we have idles
      else if (analog_settled && !sto && idle && !aset_done) begin
        adapt_machine = #fdly in_idle;
        ecnt = #fdly had_idle? ecnt : 0;
        stmr_clr = #fdly 1'b0;
        had_idle = #fdly 1'b1;
      end // Settled, but we've got no idles
      else if (analog_settled && !sto && !idle && !aset_done) begin
        adapt_machine = #fdly analog_settle;
        stmr_clr = #fdly 1'b0;
        had_idle = #fdly had_idle;
      end else adapt_machine = #fdly wait_for_command;
   end
// ----------------------------------------------------------------

// ----------------------------------------------------------------
in_idle: begin // Waiting for idle to go away
   if (idle && !sto) adapt_machine = #fdly in_idle;

// Idle is gone, now look for ijk
   else if (!idle && !sto && !ijk) begin
     adapt_machine = #fdly wait_for_ijk;
     ltmr_clr = #fdly 1'b1;
   end // In some modes idle can go away the same time ijk comes
   else if (!idle && !sto && ijk) begin
     adapt_machine = #fdly wait_for_tr;
     ltmr_clr = #fdly 1'b1;
   end // Scan timed out
   else begin
     adapt_machine = #fdly analog_settle;
     aset = #fdly aset + 1;
     stmr_clr = #fdly 1'b1;
     had_idle = 1'b0;
   end
end
// ----------------------------------------------------------------

// ----------------------------------------------------------------
wait_for_ijk: begin // Timed out waiting for ijk
   if (ijkto && !sto) begin
     adapt_machine = #fdly analog_settle;
     ecnt = #fdly ecnt_maxed ? ecnt : ecnt + 1;
     ltmr_clr = #fdly 1'b1;
   end // Still waiting for ijk, no ijk time out yet
```

```
    else if (!ijk && !ijkto && !sto) begin
      adapt_machine = #fdly wait_for_ijk;
      ltmr_clr = #fdly 1'b0;
    end // We got ijk before the time out
    else if (ijk && !ijkto && !sto) begin
      adapt_machine = #fdly wait_for_tr;
      ltmr_clr = #fdly 1'b1;
    end // We got a scan timeout
    else begin
      adapt_machine = #fdly analog_settle;
      stmr_clr = #fdly 1'b1;
      aset = #fdly aset + 1;
      ltmr_clr = #fdly 1'b1;
      had_idle = 1'b0;
    end
end
// ---------------------------------------------------------------------

// ---------------------------------------------------------------------
wait_for_tr: begin // No tr yet, keep waiting
    if (!tr && !sto && !inv && !idle) adapt_machine = #fdly wait_for_tr;

// Got a tr before the idle
    else if (tr && !sto && !idle) begin
      adapt_machine = #fdly wait_for_idle;
      ltmr_clr = #fdly 1'b1;
    end // No tr, but we got an invalid code
    else if (!tr && !sto && inv && !idle) begin
      adapt_machine = #fdly wait_for_tr;
      ecnt = #fdly ecnt_maxed ? ecnt : ecnt + 1;
    end // It got an idle before the tr
    else if (!tr && !sto && idle) begin
      adapt_machine = #fdly analog_settle;
      stmr_clr = #fdly 1'b0;
      ecnt = #fdly ecnt_maxed ? ecnt : ecnt + 1;
      had_idle = 1'b1;
    end // Scan timed out
    else begin
      adapt_machine = #fdly analog_settle;
      stmr_clr = #fdly 1'b1;
      aset = #fdly aset + 1;
      ecnt = #fdly ecnt_maxed ? ecnt : ecnt + 1;  // Should we penalize her
      had_idle = 1'b0;
    end
end
// ---------------------------------------------------------------------
```

```
   // ----------------------------------------------------------------
   wait_for_idle: begin // idle timeout
      if (idleto && !sto) begin
        adapt_machine = #fdly analog_settle;
        ecnt = #fdly ecnt_maxed ? ecnt : ecnt+1;
        ltmr_clr = #fdly 1'b1;
      end // Still waiting for idle
      else if (!idle && !idleto && !sto) begin
        adapt_machine = #fdly wait_for_idle;
        ltmr_clr = #fdly 1'b0;
      end // We got the idle in time
      else if (idle && !idleto && !sto) begin
        adapt_machine = #fdly in_idle;
        ltmr_clr = #fdly 1'b1;
      end // Scan timed out before idle came
      else begin
        adapt_machine = #fdly analog_settle;
        aset = #fdly aset+1;
        stmr_clr = #fdly 1'b1;
        ltmr_clr = #fdly 1'b1;
        had_idle = 1'b0;
      end
    end
    // ----------------------------------------------------------------

// For robustness sake
    unused: adapt_machine = #fdly wait_for_command;

endcase
end // always

// Edge detection of adaptor #2 start command
always @(posedge CLK) TSTSR = #fdly {TSTSR[1:0],ADAPTST};
assign start = TSTSR[1] && !TSTSR[2];

// ---- Set up counters ----------------------------------------------
always @(posedge CLK or negedge RESETn) begin
  if (!RESETn) stmr = #fdly 15'h0;
  else stmr = #fdly (stmr_clr || sto) ? 0 : stmr + 1;
end always @(posedge CLK or negedge RESETn) begin
  if (!RESETn) ltmr = #fdly 3'h0;
  else ltmr = #fdly ltmr_clr ? 3'h0 : ltmr + 1;
end
// ------------------------------------------------------------------
```

```
// Set values for state machine
assign sto =              (stmr == 15'h7fff);          // 1.3mSec
assign analog_settled =   (stmr[14:9] != 6'h0);        // 20uSec
assign ijkto =            (ltmr==3'h7);
assign idleto =           (ltmr==3'h7);
assign aset_done =        (aset[5] == 1'b1);
assign ecnt_maxed =       (ecnt == `err_max);

// ----- Survival of the Fittest ------------------------------------------
assign newbest = ((stmr == 15'h1) && (ecnt < least_err) &&
                  !(adapt_machine == are_you_sure) &&
                     !(adapt_machine == wait_for_command));

always @(posedge CLK or negedge RESETn) begin if (!RESETn) begin
    best_set = #fdly 5'b00000;
    least_err = #fdly `err_max;
  end // A stronger member has been found
  else if (newbest) begin
    best_set = #fdly aset - 1;
    least_err = #fdly ecnt;
  end // Starting scan, so set err to max and best to first
  else if ((sto && (adapt_machine == are_you_sure)) ||
            ((adapt_machine == wait_for_command) && start)) begin
    best_set = #fdly 5'b00000;
    least_err = #fdly `err_max;
  end // Otherwise, don't change anything
  else begin
    best_set = #fdly best_set;
    least_err = #fdly least_err;
  end
end
// ------------------------------------------------------------------------

// ----- Set the Equalizer Chain ------------------------------------------
assign EQC2 = ((adapt_machine==wait_for_command) ||
               (adapt_machine==are_you_sure)) ? best_set[3:0] : aset[3:0];
assign ATC2 = ((adapt_machine==wait_for_command) ||
               (adapt_machine==are_you_sure)) ?
                              {1'b0,best_set[4],best_set[4]} :
                                  {1'b0,aset[4],aset[4]};

// ---- Set Test Outputs --------------------------------------------------
assign STATE = adapt_machine;
assign SCANTIMEOUT = sto;
assign LATENCYTIMEOUT = ijkto || idleto;
assign ERROR =    ((adapt_machine==analog_settle) && (sto && !aset_done))
                  ((adapt_machine==wait_for_ijk)  && (ijkto && !sto))
```

```
                ((adapt_machine==wait_for_tr)   && (!tr && !sto && idle))     ||
                ((adapt_machine==wait_for_tr)   && (!tr&&!sto&&inv&&!idle))   ||
                ((adapt_machine==wait_for_tr)   && (sto))                     ||
                ((adapt_machine==wait_for_idle) && (idleto && !sto));
assign NEWBEST = newbest;
// ------------------------------------------------------------------ endmodule
```

What is claimed is:

1. An adaptive equalizer comprising:
a variable filter coupled to an input line, the variable filter receiving an analog input signal and producing a filtered analog signal;
a converter coupled to the variable filter, the converter receiving the filtered analog signal and producing a digital signal;
a bit sequence indicator coupled to the converter, the bit sequence indicator receiving the digital signal; and
an adaptor circuit coupled to the bit sequence indicator, the adaptor circuit providing a control signal to the variable filter, the control signal adjusting the variable filter;
wherein the bit sequence indicator further comprises:
means for identifying portions of a bit sequence transmitted in a data transmission on a network; and
means for producing an indicator signal for each portion of the bit sequence.

2. The adaptive equalizer of claim 1 wherein the bit sequence in an Ethernet network further comprises a first idle identifier, a start packet identifier, data, a stop packet identifier and a second idle identifier.

3. The adaptive equalizer of claim 1 wherein the adaptor circuit further comprises:
means for receiving the indicator signal; and
means for producing the control signal to the variable filter when the indicator signal indicates an error in the digital signal.

4. An adaptive equalizer comprising:
means for receiving an analog signal;
means for producing a filtered analog signal coupled to the means for receiving;
means for converting the filtered analog signal to a digital signal coupled to the means for producing;
means for monitoring the digital signal coupled to the means for converting; and
means for adjusting the means for producing the filtered analog signal coupled to the means for monitoring;
wherein the means for monitoring further comprises:
means for identifying portions of a bit sequence transmitted in a data transmission on a network; and
means for producing an indicator signal for each portion of the bit sequence.

5. The adaptive equalizer of claim 4 wherein the bit sequence in an Ethernet network further comprises an idle identifier, a start packet identifier, data bits and a stop packet identifier.

6. The adaptive equalizer of claim 4 wherein the means for adjusting further comprises:
means for receiving the indicator signal;
means for producing a control signal to the means for producing the filtered analog signal when the indicator signal indicates an error in the digital signal, the control signal adjusting the means for producing a filtered analog signal.

7. A method of equalizing an analog signal comprising the steps of:
filtering the analog signal to produce a filtered analog signal;
converting the filtered analog signal to a digital signal;
detecting errors in the digital signal; and
adapting the filtering step according to the errors found in the digital signal;
wherein the step of detecting errors in the digital signal further comprises the steps of:
monitoring the digital signal for a known bit sequence;
producing an indicator signal for each portion of the known bit sequence; and
detecting errors in the known bit sequence based on the indicator signal.

8. The method of claim 7 wherein the step of monitoring the known bit sequence further comprises the steps of:
monitoring the known bit sequence for an idle identifier;
monitoring the known bit sequence for a start packet identifier;
monitoring the known bit sequence for data symbols; and
monitoring the known bit sequence for a stop packet identifier.

9. The method of claim 7 wherein the step of adapting the filtering step further comprises the step of varying a cutoff frequency in the step of filtering an analog signal according to the errors in the known bit sequence.

* * * * *